United States Patent [19]

Sechi

[11] 4,124,823

[45] Nov. 7, 1978

[54] MICROWAVE COUPLER

[75] Inventor: Franco N. Sechi, Lawrenceville, N.J.

[73] Assignee: RCA Corporation, New York, N.Y.

[21] Appl. No.: 739,821

[22] Filed: Nov. 8, 1976

[51] Int. Cl.[2] ........................... H03F 3/60; H01P 5/12

[52] U.S. Cl. ....................................... 330/56; 330/286; 330/295; 333/9; 333/21 R

[58] Field of Search ............... 333/6, 9, 21 R; 330/56, 330/286, 295

[56] References Cited

U.S. PATENT DOCUMENTS

| | | | |
|---|---|---|---|
| 2,825,876 | 3/1958 | Le Vine et al. | 333/84 M X |
| 2,961,659 | 11/1960 | Kuecken | 333/9 X |
| 3,109,996 | 11/1963 | Allen | 333/6 |
| 3,843,941 | 10/1974 | Hudspeth et al. | 333/9 |
| 3,869,678 | 3/1975 | Mahoney | 330/286 |
| 3,963,993 | 6/1976 | Hoffman et al. | 330/124 R |

*Primary Examiner*—Paul L. Gensler

*Attorney, Agent, or Firm*—H. Christoffersen; Joseph D. Lazar

[57] ABSTRACT

A first group of electrically conductive sheets are mounted within a first rectangular waveguide that is connected to a signal power source. A second group of electrically conductive sheets are mounted within a second rectangular waveguide that is connected to a load. The sheets divide corresponding parts of the first and second waveguides into first and second pluralities of smaller waveguides, respectively. Each one of the first smaller waveguides is coupled to an associated one of a plurality of amplifiers at the input thereof. Each one of the second smaller waveguides is coupled to an associated one of the amplifiers at the output thereof. The first smaller waveguides cause power from the signal source to be divided into parts that are amplified by the amplifiers. The second smaller waveguides couple energy from the amplifiers to the load via the second waveguide whereby the amplified power is combined and provided to the load.

9 Claims, 7 Drawing Figures

MICROWAVE COUPLER

BACKGROUND OF THE INVENTION

1. Field of the Invention

This invention relates to transmission of energy at microwave frequencies and more particularly to providing power from a single signal source to a plurality of loads and from a plurality of signal sources to a single load.

2. Description of the Prior Art

A device, such as a transistor, has an undesirably low capability for providing power at microwave frequencies. Because of the low power capability, a power amplifier in the microwave art is usually comprised of a plurality of transistors connected in parallel, whereby each of the transistors contributes a portion of power provided to a single load.

The transistor inherently has input and output impedances that are low in comparison with the characteristic impedance of a transmission line, such as a waveguide, for example. Since the amplifier is comprised of the plurality of transistors connected in parallel, the amplifier has input and output impedances (referred to as terminal impedances) that are much lower than the characteristic impedance. Therefore, there is usually a severe mismatch between a terminal impedance and the characteristic impedance.

The severe mismatch is usually obviated by a connection of the amplifier to the waveguide through an impedance transformation device. The transformation device typically has a bandwidth that is inversely related to a ratio (called an impedance transformation ratio) of the characteristic impedance to the terminal impedance. Therefore, because of the severe mismatch, the transformation device introduces a substantial limitation on the bandwidth of power transmitted therethrough. Hence, there is a need for a power amplifier that can be used without introducing such a bandwidth limitation.

SUMMARY OF THE INVENTION

According to the present invention, a rectangular waveguide is constructed to provide a $TE_{10}$ mode of propagation of electromagnetic energy between an end of the waveguide that has a pair of ports and a closed end of the waveguide. First and second smaller waveguides are formed within the waveguide by an electrically conductive sheet. When the waveguide is operated as a divider, the first and second smaller waveguides are respectively coupled through the ports to first and second loads, whereby the waveguide has a load that is equivalent to the first and second loads connected in series. A single signal power source may be connected to the waveguide to cause an electromagnetic energy signal to propagate towards the ports, thereby providing power from the signal source to the first and second loads. when the waveguide is operated as a combiner, a single load is connected to the waveguide and the first and second smaller waveguides are respectively coupled through the ports to first and second signal power sources that cause an electromagnetic energy signal to propagate through each of the smaller waveguides towards the closed end, whereby power is coupled from the first and second signal sources to the single load.

DETAILED DESCRIPTION OF THE PREFERRED EMBODIMENT

In the preferred embodiment, construction of a microwave coupler is predicated upon one or more electrically conductive sheets dividing a rectangular waveguide into a plurality of smaller rectangular waveguides.

Figures 1, 2, 3:
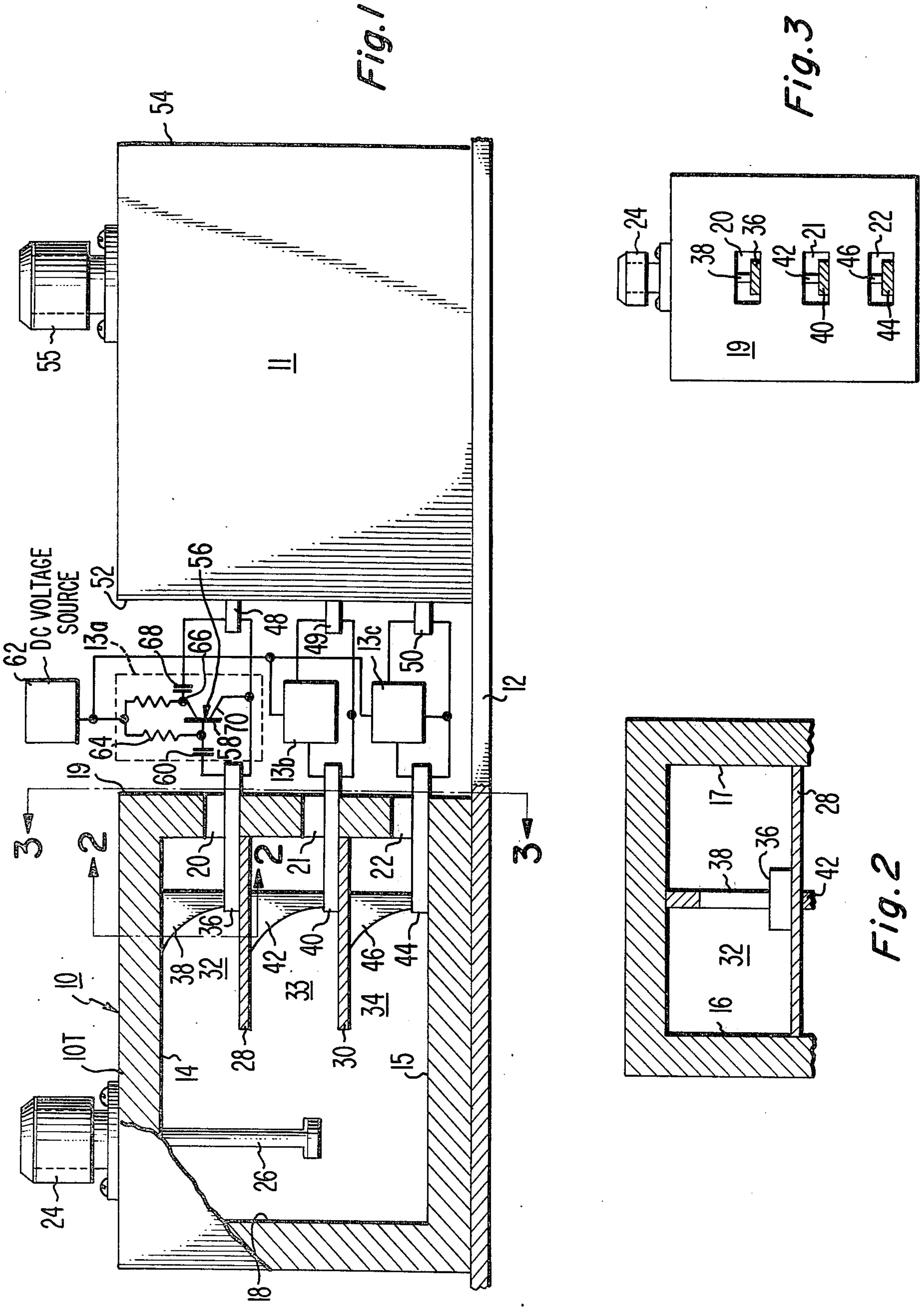
FIG. 1 is a side elevation, partly in section, of a preferred embodiment of a microwave coupler of the present invention.
FIG. 2 is a view of a smaller waveguide in the embodiment of FIG. 1 taken along a line 2—2.
FIG. 3 is a view of the microwave coupler of FIG. 1 taken along a line 3—3.

Shown in FIGS. 1-3 is a first microwave coupler 10 and a second microwave coupler 11 (structurally similar to coupler 10) both mounted upon a common ground plane 12 that electrically connects couplers 10 and 11 to a common ground. Additionally, couplers 10 and 11 are coupled together through similar amplifiers **13*a*, 13*b*, and 13*c*. As explained hereinafter, signal power applied to coupler 10 is divided into three parts and each of the amplifiers 13 has coupled thereto a part of the input signal power. Amplifiers 13 provide amplified power that is coupled by coupler 11 to a single load at an output thereof. Therefore, couplers 10 and 11** operate as a power divider and a power combiner, respectively.

Coupler 10 is a rectangular waveguide having interior opposed surfaces 14 and 15 with interior opposed surfaces 16 and 17 perpendicular thereto. The spacing between surfaces 14 and 15 and between surfaces 16 and 17 is selected to provide a $TE_{10}$ mode of propagation of electromagnetic energy in a direction parallel to surfaces 14, 15, 16, and 17. Additionally, coupler 10 has a closed end 18 and a multiple port end 19 with ports 20, 21, and 22.

Mounted upon a top wall 10T of coupler 10 is a coaxial connector 24 with a central probe 26 (such as an antenna) that extends through surface 14 into the cavity of coupler 10. In response to a voltage from a signal power source (not shown) coupled to connector 24, electromagnetic energy propagates in the $TE_{10}$ mode from probe 26. Preferably, probe 26 is disposed midway between surfaces 16 and 17 at a distance from end 18 equal to one-fourth of the wavelength associated with the electromagnetic energy, whereby end 18 reflects, without interference, electromagnetic energy that is propagated thereto from probe 26. Because of the spacing between surfaces 14-17 and the reflection of electromagnetic energy, substantially all of the electromagnetic energy from probe 26 propagates towards end 19 in the $TE_{10}$ mode.

Coupler 10 encloses electrically conductive sheets 38 and 30 that are connected perpendicularly to surfaces 16 and 17 whereby the surfaces of sheets 28 and 30 are parallel to surfaces 14 and 15. The surfaces of sheets 28 and 30 are perpendicular to lines of force of an electric field associated with the $TE_{10}$ mode of propagation. Therefore, sheets 28 and 30 do not affect such a mode of propagation. In this embodiment distances between surface 14 and sheet 28, sheets 28 and 30, and sheet 30 and surface 15 are all equal. In an alternative embodiment, the distances may differ from one another.

Sheets 28 and 30 divide a part of the interior of coupler 10 into smaller waveguides 32, 33, and 34 which are all connected to ground in any suitable manner. Correspondingly, sheets 38 and 30 divide the electromagnetic energy from probe 26 into first, second, and third portions that are propagated through smaller waveguides 32–34, respectively. When the smaller waveguides 32–34 are each connected to a separate load, coupler 10 has a load equivalent to the separate loads of the waveguides 32–34 connected in series. Additionally, when the equivalent load equals the characteristic impedance of coupler 10, coupler 10 thus has a matching load.

Within smaller waveguide 32 is a microstrip line 36 mounted midway between surfaces 16 and 17, upon sheet 28. The conductor of line 36 is connected to one edge of a tapered ridge (planar) transformer 38, the other edge of transformer 38 being connected to surface 14 so that transformer 38 is positioned midway between surfaces 16 and 17.

It should be understood that the $TE_{10}$ mode of propagation establishes the electric field referred to hereinbefore to be maximum midway between the surfaces 16 and 17. Since transformer 38 is midway between surfaces 16 and 17, transformer 38 is optimally positioned to couple energy from smaller waveguide 32 in a manner well known in the art.

A first portion of the electromagnetic energy is coupled to microstrip line 36 via transformer 38 whereby a first part of the signal power (associated with the voltage of the signal power source applied to connector 24) may be coupled to a load as explained hereinafter.

Line 36 extends through port 20 to the exterior of coupler 10 where it is connected to an input of amplifier 13*a*. The input of amplifier 13*a* is thus a load on smaller waveguide 32. It should be appreciated that because smaller waveguide 32 is connected to ground, amplifier 13*a* is also connected to ground whereby amplifier 13*a* may be conveniently connected to a heat sink (not shown).

In a similar manner, a microstrip line 40 is mounted midway between surfaces 16 and 17, upon sheet 30. Line 40 is connected to one edge of a tapered ridge transformer 42, the other edge of transformer 42 being connected to sheet 28. When a second portion of the electromagnetic energy is propagated within smaller waveguide 33, it is coupled to line 40 via transformer 42 whereby a second part of the signal power may be coupled to a load.

Similarly, a microstrip line 44 is mounted midway beteen surfaces 16 and 17 upon surface 15. Line 44 is connected to one edge of a tapered ridge transformer 46, the other edge of transformer 46 being connected to sheet 30. When a third portion of the electromagnetic energy is propagated within smaller waveguide 34, it is coupled to line 44 via transformer 46, whereby a third part of the signal power may be coupled to a load.

Lines 40 and 44 extend through ports 21 and 22 to the exterior of coupler 10 and are connected to inputs of amplifier 13*b* and 13*c*, respectively. Therefore, the input impedances of amplifiers 13*b* and 13*c* (similar to the input of amplifier 13*a*) are loads on smaller waveguides 33, 34, respectively. Accordingly, when the sum of the input impedances of amplifiers 13 equals the characteristic impedance of coupler 10, the input impedances comprise an equivalent load that matches the characteristic impedance of coupler 10.

Amplifiers 13 are selected from any of the well known types which amplify applied power as described hereinafter. Amplifiers 13*a*, 13*b*, and 13*c* amplify the first, second, and third parts of the signal power, respectively. The outputs of amplifiers 13*a*, 13*b*, and 13*c* are connected to microstrip lines 48, 49, and 50, respectively, whereby the amplified power is provided to coupler 11.

It should be understood that rectangular waveguides, tapered ridge transformers and microstrip lines are all bilateral network elements. Since couplers 10 and 11 are similar and bilateral, the amplified power causes electromagnetic energy to propagate from the multiport end 52 of coupler 11 towards the closed end 54 thereof. The ends 52 and 54 of coupler 11 correspond, respectively to ends 19 and 18 of coupler 10. The electromagnetic energy from end 52 is propagated by the three lines and the amplified power of each is combined and available for application to a single load (not shown) connected to a coaxial connector 55 (similar to connector 24) of coupler 11 in a manner reversed to that of the power division of coupler 10. It should be understood that when the impedance of the single load substantially equals the characteristic impedance of coupler 11, the single load and the characteristic impedance of coupler 11 are matched.

Amplifier 13*a* is typically comprised of a bipolar transistor 56, the base 58 thereof being connected to the conductor of line 36 through a capacitor 60, thereby coupling the first part of the signal power coupled to base 58. Base 58 is additionally connected to a dc voltage source 62 through a resistor 64, whereby a dc bias current is provided to base 58. Because of the first part of the signal power and the bias current, transistor 56 amplifies the first part of the signal power.

Collector 66 of transistor 56 is connected to line 48 through a capacitor 68, whereby the amplified first part of the signal power is provided to coupler 11.

The emitter 70 of transistor 56 is connected to ground and to the case (not shown) of transistor 56. It is usually desirable for high power operation to connect a heat sink of such a transistor to ground. Since emitter 70 is connected to ground and to the case, the case may be conveniently mounted upon a heat sink.

Figure 4:
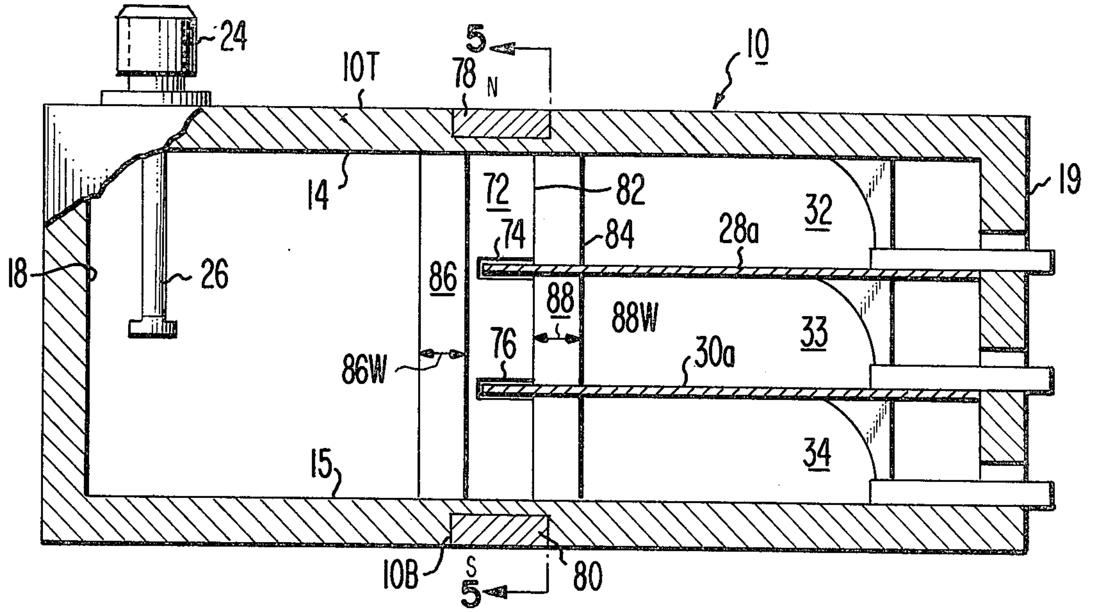
FIG. 4 is a side elevation, partly in section, of the microwave coupler of FIG. 1 modified to include a resonant isolator.
Figure 5:
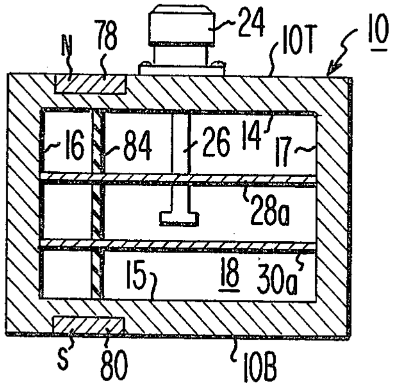
FIG. 5 is a view of the modified microwave coupler of FIG. 4 taken along a line 5—5, FIG. **6*a* is a fragmented plan view of one electrically conductive sheet included in the modified microwave coupler of FIG. 4.
Figure 6A:
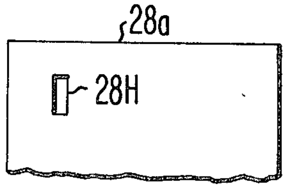
FIG. 6*b* is a fragmented plan view of another electrically conductive sheet included in the modified microwave coupler of FIG. 4**.
Figure 6B:
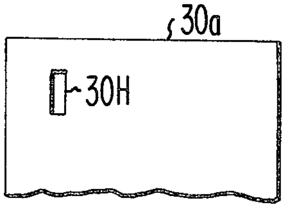

Shown in FIGS. 4–6 is coupler 10 modified to include a resonant isolator that absorbs electromagnetic energy that may be reflected from end 19. The resonant isolator is formed of a ferrite slab 72 that has its ends connected to surfaces 14 and 15, respectively. The width of slab 72 is not critical but may typically have a width that is a fraction of the wavelength. Slab 72 has slots 74 and 76 for receiving ends of the respective sheets 28*a* and 30*a* (similar to the sheets 28 and 30 of FIGS. 1–3).

Slab 72 is mounted with its surfaces substantially within a plane where, as known in the art, the propagation of the electromagnetic energy is characterized by a circularly polarized electromagnetic field. An electromagnetic field is said to be circularly polarized when it can be represented by two orthogonal vector components of equal magnitude that have a ninety degree phase difference therebetween. The plane of circular polarization is about one-fourth of the distance of surface 17 from surface 16 because of the $TE_{10}$ mode of propagation.

Slab 72 is magnetized by north pole piece 78 and a south pole piece 80 mounted within top wall 10T and bottom wall 10B, respectively, of coupler 10. As so-magnetized, slab 72 passes electromagnetic energy propagated towards end 19 and absorbs electromagnetic energy propagated from end 19. Accordingly, slab 72 functions as a unilateral circuit element. Since slab 72 is unilateral and the ends of sheets 28*a* and 30*a* are within slots 74 and 76, there can be no cross-coupling of electromagnetic energy between smaller waveguides 32, 33, and 34.

It should be understood that a ferrite slab, corresponding to slab 72, may be mounted in a similar fashion within coupler 11. However, the positions of pole pieces within coupler 11 are opposite from the positions of pole pieces 78 and 80 whereby a north pole piece and a south pole piece are mounted within the bottom and the top, respectively, of coupler 11.

It should be understood that because slab 72 is ferrite, it has a dielectric constant of about 10, thereby causing a mismatch between slab 72 and air (dielectric constant of 1.0) within coupler 10. The mismatch causes an edge 82 of slab 72 to reflect some of the electromagnetic energy propagated towards end 19.

Slab 72 may be matched to the air by dielectric slabs 86 and 88 (similar to the slab 72) that have ends connected to surfaces 14 and 15. Additionally, an edge of slab 86 abuts edge 82 of slab 72 and an edge of slab 88 abuts the other edge of slab 72. Moreover, dielectric slabs 86 and 88 pass through holes 28H and 30H in sheets 28*a* and 30*a*, respectively.

As known to those skilled in the art, such matching is optimized when slabs 86 and 88 have widths 86*w* and 88*w*, respectively, that are both substantially equal to one-quarter of the wavelength associated with the microwave power signals. Moreover, slabs 86 and 88 preferably have a dielectric constant of about 3.3 (the geometric mean of the dielectric constants of slab 72 and air). The use of dielectric slabs for matching, as described hereinbefore, is well known in the art.

While the embodiment describes amplifiers utilizing bipolar transistors, it will be appreciated that amplifiers formed of field effect transistors (FETs) may be used in practicing this invention. Furthermore, although couplers 10 and 11 utilize the $TE_{10}$ mode of propagation, in an alternative embodiment, any other suitable mode of propagation may be used.

What is claimed is:

1. A microwave apparatus, comprising:

a rectangular waveguide having a multiport end, with at least first and second ports, and a closed end;

an electrically conductive sheet, connected within said rectangular waveguide perpendicular to a pair of opposed interior surfaces thereof, to divide one part of said rectangular waveguide adjacent said multiport end into first and second smaller waveguides;

probe means for electromagnetically coupling microwave energy between the other part of said rectangular waveguide and the exterior of said rectangular waveguide;

said probe means also coupling said energy between the other part of said rectangular waveguide and said first and second smaller waveguides;

first coupling means connected to said smaller waveguides for providing first and second signal paths from said first and second smaller waveguides, respectively, for said energy to the exterior of said rectangular waveguide, said first and second signal paths being adapted for connection alternatively to respective first and second loads and to respective first and second signal sources, and second coupling means for coupling said energy between said smaller waveguides and said first coupling means.

2. The apparatus of claim 1 wherein said first coupling means comprises a microstrip line that extends through at least one of said ports from the interior to the exterior of said rectangular waveguide.

3. The apparatus of claim 2 wherein said second coupling means comprises a tapered ridge transformer connected to a wall of one of said smaller waveguides and said microstrip line.

4. The apparatus of claim 1 wherein surfaces of said sheet are perpendicular to lines of force of an electric field associated with a $TE_{10}$ mode of propagation of electromagnetic energy between said multiport end and said closed end.

5. The apparatus of claim 4 additionally comprising a resonant isolator, mounted within said rectangular waveguide, adapted for magnetization in a direction that causes said isolator to absorb electromagnetic energy that propagates towards said closed end and adapted for magnetization in an opposite direction that causes said isolator to absorb electromagnetic energy that propagates towards said multiport end.

6. The apparatus of claim 5 wherein said rectangular waveguide is adapted for connection to a pair of magnetic pole pieces that provide within said isolator a magnetic field with lines of force parallel to the lines of force of said electric field, said isolator comprising a rectangular ferrite slab mounted within a plane where a circularly polarized electromagnetic field is generated in response to electromagnetic energy being propagated in said $TE_{10}$ mode within said rectangular waveguide, said ferrite slab having a slotted side wherein said sheet is received.

7. The apparatus of claim 6 additionally comprising a rectangular dielectric slab mounted with one edge that abuts a side edge of said ferrite slab and an opposite edge that is one-fourth of a wavelength of said electromagnetic energy from said abutting edges.

8. The apparatus of claim 6 wherein said dielectric slab passes through a hole in said sheet.

9. A microwave amplifier comprising:

a first rectangular waveguide adapted to receive a microwave signal that causes a propagation of electromagnetic energy in a $TE_{10}$ mode within said first rectangular waveguide from a closed end towards a multiport end thereof;

an electrically conductive sheet, connected between opposed interior surfaces of said first rectangular waveguide, that divides a part thereof into a first pair of smaller waveguides;

first and second power amplifiers;

means for coupling microwave power from each of said first smaller waveguides through the multiport end of said first rectangular waveguide to an input of said first amplifier and an input of said second amplifier, respectively;

a second rectangular waveguide adapted to provide microwave power in response to a propagation therein of electromagnetic energy in a $TE_{10}$ mode from a multiport end towards a closed end of said second rectangular waveguide;

an electrically conductive sheet connected between opposed interior surfaces of said second rectangular waveguide that divides a part thereof into a second pair of smaller waveguides;

means for coupling microwave power from the output of said first amplifier and the output of said second amplifier to each of said second smaller waveguides, respectively, through the multiport end of said second rectangular waveguide to cause said propagation of electromagnetic energy therein; and means for connecting said second rectangular waveguide to a load that receives said microwave power from said amplifiers in response to the propagation of electromagnetic energy within said second rectangular waveguide.

* * * * *